United States Patent
Wu

(10) Patent No.: US 6,576,870 B2
(45) Date of Patent: Jun. 10, 2003

(54) APPARATUS WITH DOUBLE LASER BEAMS FOR CUTTING TWO BONDED GLASS SUBSTRATES AND METHOD THEREOF

(75) Inventor: Gwomei Wu, Taoyuan Hsien (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/947,110

(22) Filed: Sep. 5, 2001

(65) Prior Publication Data

US 2002/0056891 A1 May 16, 2002

(30) Foreign Application Priority Data

Nov. 13, 2000 (TW) ........................................ 89123965 A

(51) Int. Cl.7 .......................... B23K 26/38; B23K 26/02

(52) U.S. Cl. ............................ 219/121.72; 219/121.67; 219/121.76; 219/121.77; 219/121.82

(58) Field of Search ................... 219/121.67, 121.72, 219/121.76, 121.77, 121.82

(56) References Cited

U.S. PATENT DOCUMENTS

| | | | | | |
|---|---|---|---|---|---|
| 5,093,549 | A | * | 3/1992 | Iwai et al. .............. | 219/121.67 |
| 5,138,131 | A | * | 8/1992 | Nishikawa et al. .... | 219/121.67 |
| 5,521,352 | A | * | 5/1996 | Lawson .................. | 219/121.67 |
| 5,578,229 | A | * | 11/1996 | Barnekov et al. ....... | 219/121.67 |
| 6,087,625 | A | * | 7/2000 | Iso ........................... | 219/121.6 |
| 6,407,360 | B1 | * | 6/2002 | Choo et al. ............ | 219/121.67 |

* cited by examiner

Primary Examiner—M. Alexandra Elve
Assistant Examiner—Kevin McHenry

(57) ABSTRACT

An apparatus for cutting a laminated structure formed by two bonded glass substrates comprises a worktable, and at least one laser generator. The worktable has at least one liner opening, wherein the laminated structure is placed on the worktable and a predetermined scribing line on the laminated structure is aligned to the liner opening. The laser generator generates a first laser beam over the worktable and a second laser beam under the worktable. The first laser beam irradiates the predetermined scribing line on the upper glass substrate of the laminated structure. The second laser beam passes through the liner opening and irradiates the predetermined scribing line on the lower glass substrate of the laminated structure.

28 Claims, 5 Drawing Sheets

APPARATUS WITH DOUBLE LASER BEAMS FOR CUTTING TWO BONDED GLASS SUBSTRATES AND METHOD THEREOF

BACKGROUND OF THE INVENTION

1. Field of the Invention

The present invention relates to an apparatus for cutting two bonded glass plates and, more particularly, to an apparatus with double laser beams for cutting an LCD cell and a method thereof.

2. Description of the Related Art

As semiconductor technique evolves and various electrical devices is made available, electrical displays, such as LCDs, VFDs, PDPs, and ELDs, serving as a bridge between the electrical equipment and operators, play an important role. LCD, with the advantages of low power consumption, thin profile, light weight, low driving voltage and color display, has especially been put to many practical uses.

In fabricating a small-size LCD, in order to increase product yield and decrease process costs, a plurality of liquid crystal cells are simultaneously formed within two bonded glass plates. Therefore, prior to injecting liquid crystals into the cell, the double-layered glass substrate must be cut to separate the cells. Alternatively, the cells can be separated after injecting liquid crystals into the double-layered glass substrate. FIGS. 1A~1G are schematic diagrams showing a conventional method of forming liquid crystal cells. As shown in FIG. 1A, a plurality of transparent electrodes 3, 4, 5 and 6 are formed on an upper glass substrate 1 and a lower glass substrate 2. Then, as shown in FIG. 1B, a plurality of alignment layers 7, 8, 9 and 10 are respectively formed on the transparent electrodes 3~6. Next, as shown in FIG. 1C, a sealing material 12 and 13 is coated on the edges of the upper glass substrate 1 and the lower glass substrate 2, and granular spacers are spread on a display area surrounded by the sealing material 12 and 13. Using bonding technique, the upper glass substrate 1 and the lower glass substrate 2 are bonded to become a laminated structure 16. Thereafter, by applying adequate heat and pressure to the laminated structure 16, the sealing material 12 and 13 is hardened to define a plurality of gaps 14 and 15 to be filled with liquid crystals before or after the cutting process.

As shown in FIG. 1D, scribing lines are scribed with a blade 25 on the outer surface of the upper glass substrate 1 so as to form half-cut lines 17. Then, as shown in FIG. 1E, by turning over the laminated structure 16, scribing lines are scribed with the blade 25 on the outer surface of the lower glass substrate 2 so as to form half-cut lines 18. Subsequently, as shown in FIG. 1F, using the blade 25 or applying a stress to the half-cut lines 17 and 18, the laminated structure 16 is cut off along the scribing lines, thus separating liquid crystal cells 20 and 21. If liquid crystals 22 and 23 are injected into the cells 20 and 21, the cutting result is shown in FIG. 1G. Finally, steps of grinding and cleaning are required to complete the cutting process.

However, the step of turning over the laminated structure 16 inflicts damage on the cells 20 and 21. In addition, the two steps of scribing the scribing lines respectively on the glass substrates 1 and 2 increase the process time. Furthermore, by using the blade 25 to scribe the scribing lines, lateral stress on the glass substrates 1 and 2 causes rugged cutting lines that need extra smoothing. This decreases the quality of the cutting process and increases production costs.

Thus, a novel apparatus for cutting the liquid crystal cells and a method of forming the same is called for.

SUMMARY OF THE INVENTION

The present invention provides an apparatus with double laser beams for cutting a laminated structure into liquid crystal cells to solve the conventional problems.

The apparatus for cutting a laminated structure formed by two bonded glass substrates comprises a worktable, and at least one laser generator. The worktable has at least one liner opening, wherein the laminated structure is placed on the worktable and a predetermined scribing line on the laminated structure is aligned to the liner opening. The laser generator generates a first laser beam over the worktable and a second laser beam under the worktable. The first laser beam irradiates the predetermined scribing line on the upper glass substrate of the laminated structure. The second laser beam passes through the liner opening and irradiates the predetermined scribing line on the lower glass substrate of the laminated structure.

Accordingly, it is a principal object of the invention to provide double laser beams to simultaneously cut the upper glass substrate and the lower glass substrate.

It is another object of the invention to omit the step of turning over the laminated structure during the cutting process.

Yet another object of the invention is to avoid the problem caused by lateral stress.

It is a further object of the invention to assure the cutting quality.

Still another object of the invention is to reduce cutting time and process costs.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
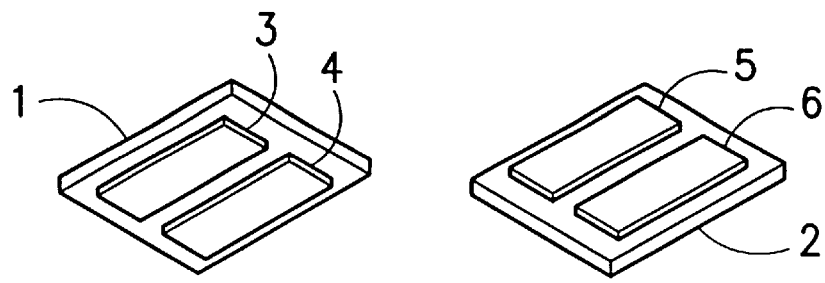
FIGS. 1A~1G are schematic diagrams showing a conventional method of forming liquid crystal cells.
Figure 1B:
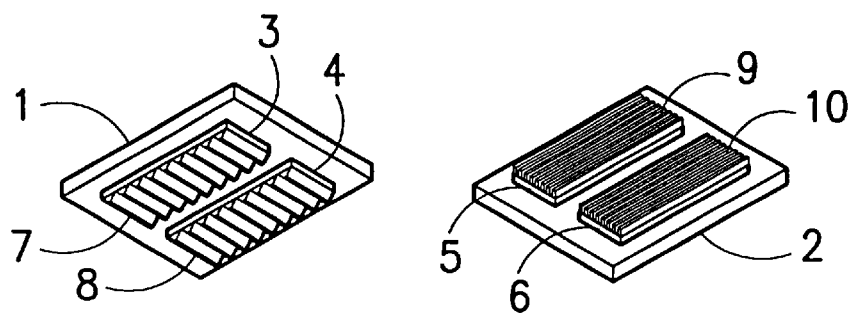
Figure 1C:
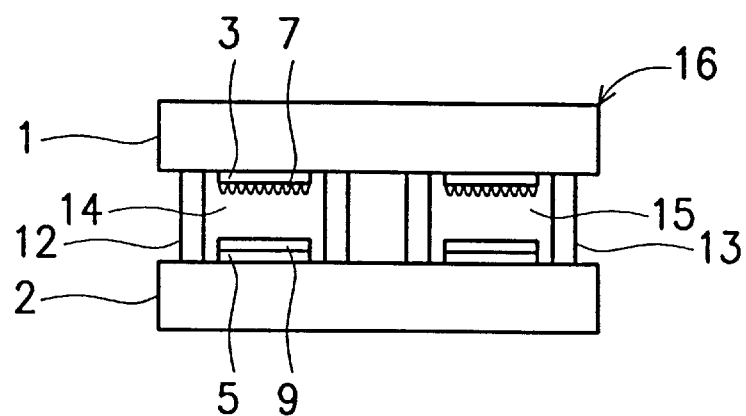
Figure 1D:
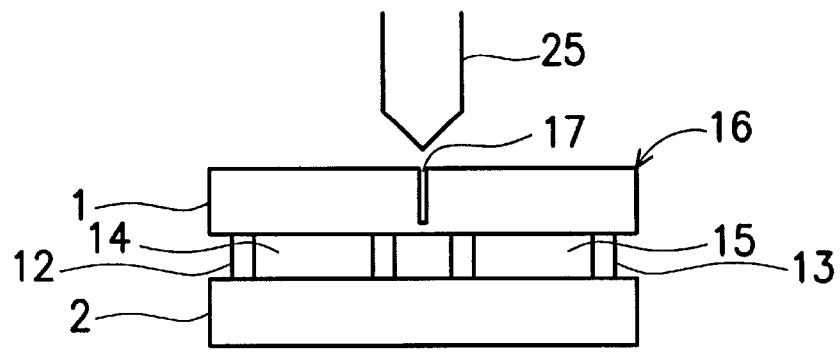
Figure 1E:
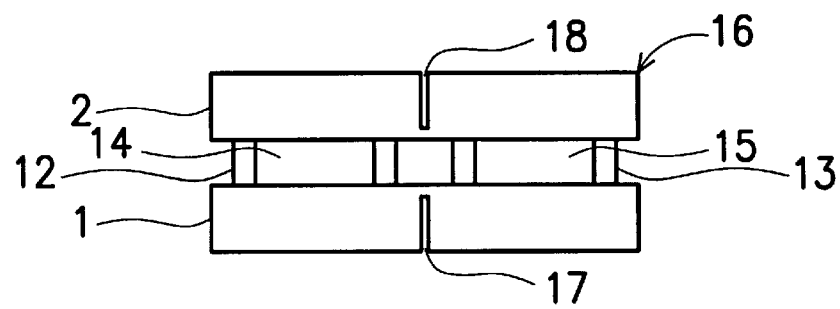
Figure 1F:
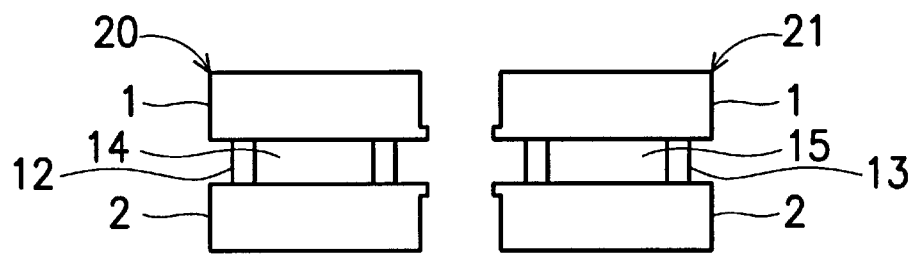
Figure 1G:
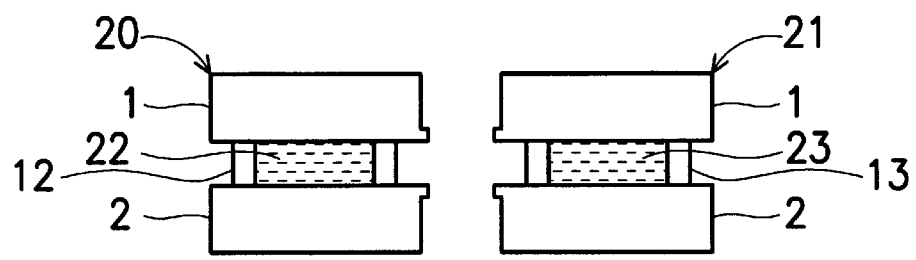
Figure 2:
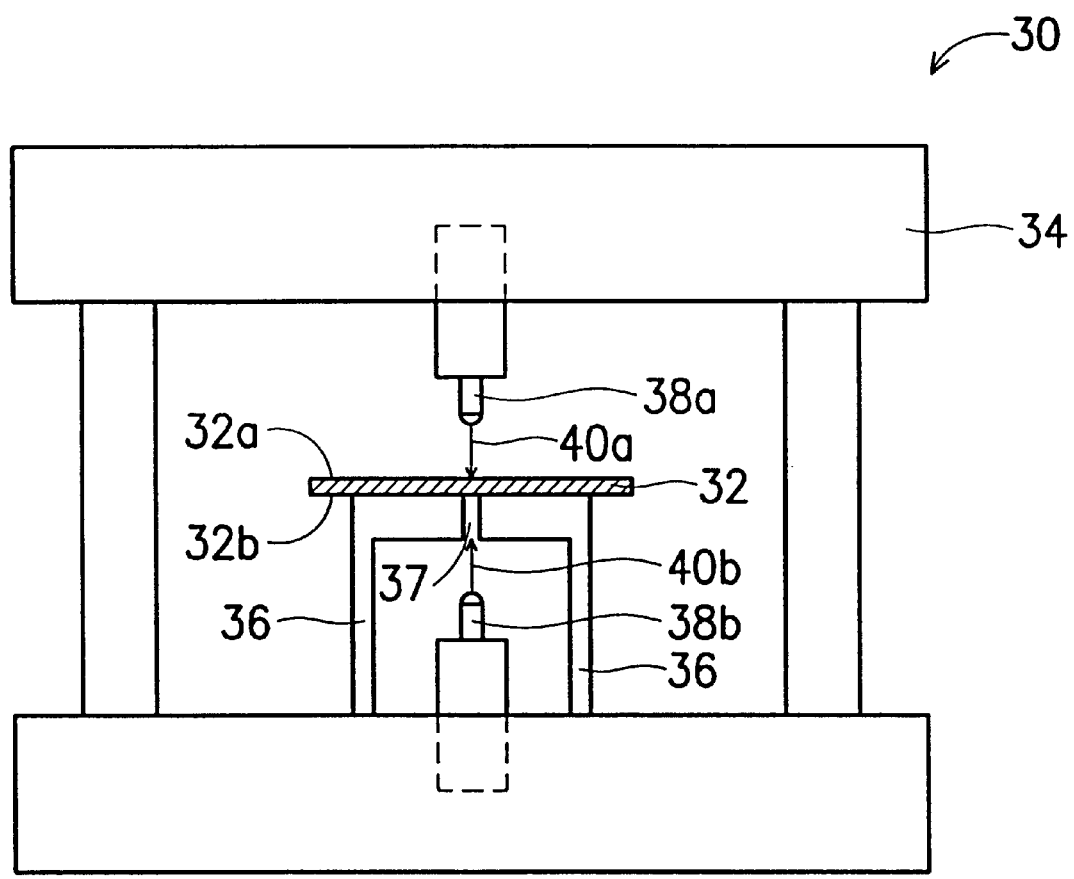
FIG. 2 is a schematic diagram of a cutting apparatus according to the present invention.

FIG. 2 is a schematic diagram of a cutting apparatus 30 according to the present invention. The cutting apparatus 30 with double laser beams is used to cut a laminated structure 32 formed by two bonded glass plates, especially for cutting liquid crystal cells. The cutting apparatus 30 comprises a support member 34, a worktable 36, a first laser working head 38a installed over the worktable 36, a second laser working head 38b installed under the worktable 36, and at least one laser generator. The worktable 36 has at least one liner opening 37, and the laminated structure 32 placed on the worktable 36 has a scribing line positioned corresponding to the liner opening 37. Preferably, the laminated structure 32 has an upper glass substrate 32a with a first predetermined scribing line and an lower glass substrate 32b with a second predetermined scribing line, in which the predetermined scribing line may be formed by a laser or a blade.

The laser generator provides a first laser beam 40a generated from the first laser working head 38a to irradiate the upper glass substrate 32a of the laminated structure 32, and a second laser beam 40b generated from the second laser working head 38b and passing through the liner opening 37 to irradiate the lower glass substrate 32b of the laminated structure 32.

While cutting the laminated structure 32, the first laser beam 40a and the second laser beam 40b are simultaneously used to cut the glass substrates 32a and 32b, thus the step of turning over the laminated structure 32 is omitted. This can reduce cutting time and assure the cutting quality of liquid crystal cells. Also, by using double laser beams to replace mechanical cutting with a blade, the problem caused by the lateral stress is avoided and the cutting line is smoothed. This omits extra treatments on the cutting lines, saving process costs.

Figure 3A:
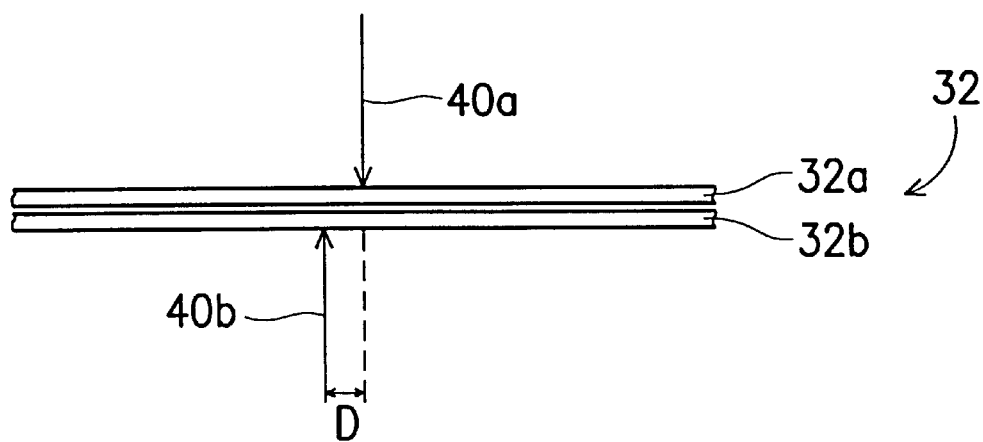
FIG. 3A is a schematic diagram showing the horizontal distance between the first laser beam and the second laser beam.
Figure 3B:
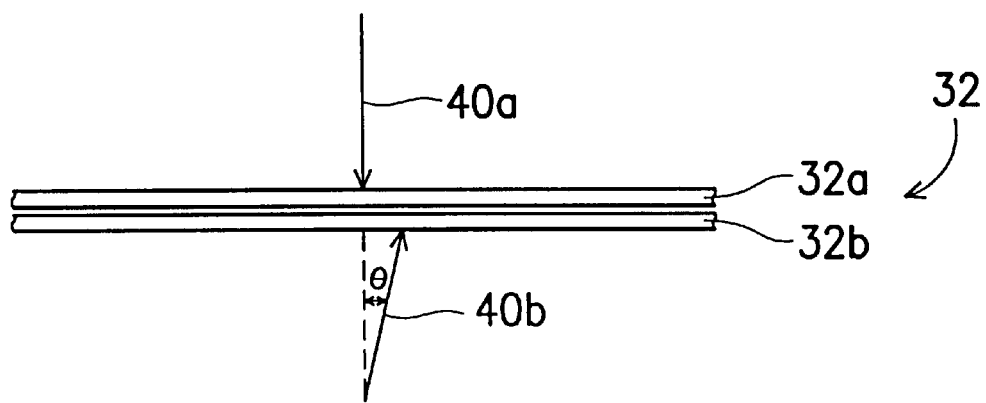
FIG. 3B is a schematic diagram showing the shift angle between the incident angle of the first laser beam and the incident angle of the second laser beam.

For increasing the using efficiency and cutting accuracy of the cutting apparatus 30, the worktable 36 can be a horizontally-movable worktable to make the laminated structure 32 self-align the laser beams 40a and 40b. In addition, the cutting apparatus 30 can install an X-Y scanner for fine tuning the irradiating position or the incident angles of the first laser beam 40a and the second laser beam 40b. This prevents the first laser beam 40a and the second laser beam 40b from contacting each other, creating an overheating situation with serious equipment damage. As shown in FIG. 3A, the horizontal distance D between the first laser beam 40a and the second laser beam 40b is preferably within 10 cm. As shown in FIG. 3B, the shift angle between the incident angle of the first laser beam 40a and the incident angle of the second laser beam 40b is preferable controlled at 0°~20°.

Figure 4A:
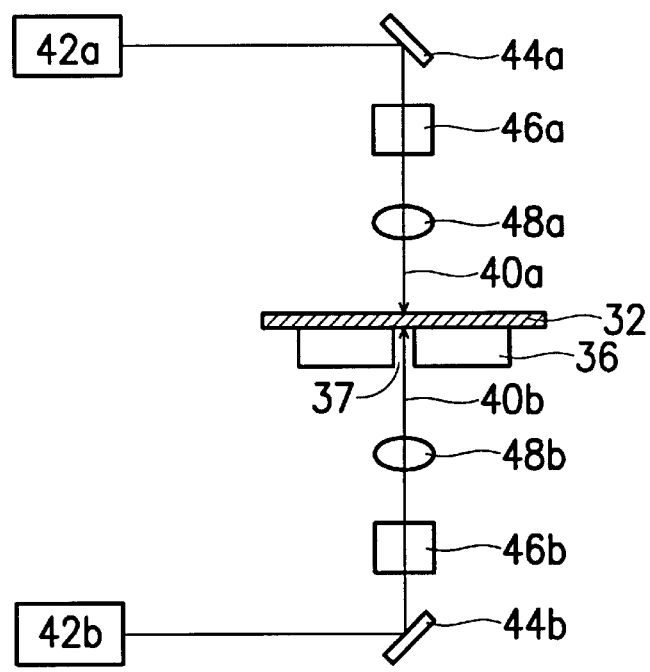
FIG. 4A is a schematic diagram of the cutting apparatus according to the first embodiment of the present invention.

FIG. 4A is a schematic diagram of the cutting apparatus according to the first embodiment of the present invention. In the first embodiment, the cutting apparatus provides a first laser generator 42a for generating the first laser beam 40a and a second laser generator for generating the second laser beam 40b. For example, when the first laser generator 42a generates the first laser beam 40a, the first laser beam 40a passes through at least one reflector 44a to a first X-Y scanner 46a. Thus, the first X-Y scanner 46a can horizontally move the first laser beam 40a to the optimum position. Next, by passing through a first lens 48a, the first laser beam 48a irradiates the first predetermined scribing line on the upper glass substrate 32a of the laminated structure 32. Similarly, by passing trough at least one second reflector 44b, a second X-Y scanner 46b, a second lens 48b, the second laser beam 40b is guided to pass through the liner opening 37 to irradiate the second predetermined scribing line on the lower glass substrate 32b of the laminated structure 32

Figure 4B:
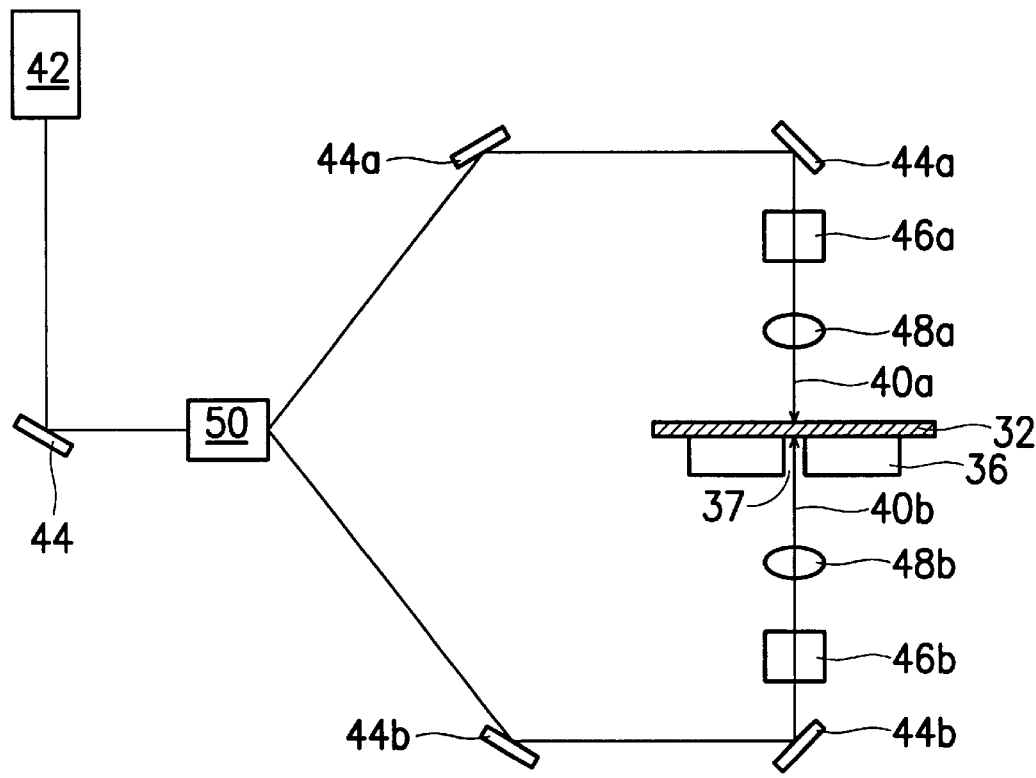
FIG. 4B is a schematic diagram of the cutting apparatus according to the second embodiment of the present invention.

FIG. 4B is a schematic diagram of the cutting apparatus according to the second embodiment of the present invention. In the second embodiment, the cutting apparatus only provides a laser generator 42 for generating a pulse laser beam. By passing through the reflector 44 to reach a beam separator 50, the pulse laser beam is separated into the first laser beam 40a and the second laser beam 40b. Thereafter, through the reflector 44, the X-Y scanner 46 and the lens 48, the first laser beam 40a and the second laser beam 40b can irradiate the predetermined scribing lines respectively. The laser generator 42 may be a $CO_2$ gas laser vibrator, a YAG harmonics laser vibrator, or an excimer laser vibrator, increasing output power by hundreds of percent. This assures that the divided laser beams both have sufficient output power.

It is to be understood that the present invention is not limited to the embodiments described above, but encompasses any and all embodiments within the scope of the following claims.

What is claimed is:

1. An apparatus for cutting a laminated structure formed by an upper glass substrate with a first predetermined scribing line and a lower glass substrate with a second predetermined scribing line, comprising:

a worktable with at least one liner opening, wherein the laminated structure is placed on the worktable and the second predetermined scribing line is aligned to the liner opening;

a first laser generator for generating a first laser beam over the worktable, wherein the first laser beam irradiates the first predetermined scribing line; and a second laser generator for generating a second laser beam under the worktable, wherein the second laser beam passes through the liner opening and irradiates the second predetermined scribing line;

wherein, a shift angle between an incident angle of the first laser beam and an incident angle of the second laser beam is between approximately 5° and 20°.

2. The apparatus according to claim 1, wherein the worktable is horizontally moveable.

3. The apparatus according to claim 1, further comprising:

a first X-Y scanner for horizontally moving the first laser beam; and a second X-Y scanner for horizontally moving the second laser beam.

4. The apparatus according to claim 3, further comprising at least one reflector between the first X-Y scanner and the first laser generator, and at least one reflector between the second X-Y scanner and the second laser generator.

5. An apparatus for cutting a laminated structure formed by an upper glass substrate with a first predetermined scribing line and a lower glass substrate with a second predetermined scribing line, comprising:

a worktable with at least one liner opening, wherein the laminated structure is placed on the worktable and the second predetermined scribing line is aligned to the liner opening; and a laser generator for generating a first laser beam over the worktable and a second laser beam under the worktable, wherein the first laser beam irradiates the first predetermined scribing line on the upper glass substrate of the laminated structure, and the second laser beam passes through the liner opening and irradiates the second predetermined scribing line on the lower glass substrate of the laminated structure;

wherein, a shift angle between an incident angle of the first laser beam and an incident angle of the second laser beam is between approximately 5° and 20°.

6. The apparatus according to claim 5, wherein the worktable is horizontally moveable.

7. The apparatus according to claim 5, further comprising:

a first X-Y scanner for horizontally moving the first laser beam; and a second X-Y scanner for horizontally moving the second laser beam.

8. The apparatus according to claim 7, further comprising at least one reflector between the first X-Y scanner and the laser generator, and at least one reflector between the second X-Y scanner and the laser generator.

9. The apparatus according to claim 5, further comprising a beam separator for separating the original laser beam generated from the laser generator into the first laser beam and the second laser beam.

10. A method of cutting a laminated structure formed by an upper glass substrate with a first predetermined scribing line and a lower glass substrate with a second predetermined scribing line, comprising steps of:
  providing a worktable with at least one liner opening, wherein the laminated structure is placed on the worktable and the second predetermined scribing line is aligned to the liner opening;
  providing a first laser beam over the worktable, wherein the first laser beam irradiates the first predetermined scribing line on the upper glass substrate of the laminated structure; and
  providing a second laser beam under the worktable, wherein the second laser beam passes through the liner opening and irradiates the second predetermined scribing line on the lower glass substrate of the laminated structure;
  wherein, a shift angle between an incident angle of the first laser beam and an incident angle of the second laser beam is between approximately 5° and 20°.

11. The method according to claim 10, wherein the worktable is horizontally moveable.

12. The method according to claim 10, wherein the first laser beam and the second laser beam can horizontally move in position to each other.

13. The method according to claim 10, wherein the first predetermined scribing line and the second predetermined scribing line are formed by a laser.

14. The method according to claim 10, wherein the first predetermined scribing line and the second predetermined scribing line are formed by a blade.

15. An apparatus for cutting a laminated structure formed by an upper glass substrate with a first predetermined scribing line and a lower glass substrate with a second predetermined scribing line, comprising:
  a worktable with at least one liner opening, wherein the laminated structure is placed on the worktable and the second predetermined scribing line is aligned to the liner opening;
  a first laser generator for generating a first laser beam over the worktable, wherein the first laser beam irradiates the first predetermined scribing line; and
  a second laser generator for generating a second laser beam under the worktable, wherein the second laser beam passes through the liner opening and irradiates the second predetermined scribing line;
  wherein, a horizontal distance between the first laser beam and the second laser beam is between approximately 5 and 10 cm.

16. The apparatus according to claim 15, wherein the worktable is horizontally moveable.

17. The apparatus according to claim 16, further comprising:
  a first X-Y scanner for horizontally moving the first laser beam; and
  a second X-Y scanner for horizontally moving the second laser beam.

18. The apparatus according to claim 17, further comprising at least one reflector between the first X-Y scanner and the first laser generator, and at least one reflector between the second X-Y scanner and the second laser generator.

19. An apparatus for cutting a laminated structure formed by an upper glass substrate with a first predetermined scribing line and a lower glass substrate with a second predetermined scribing line, comprising:
  a worktable with at least one liner opening, wherein the laminated structure is placed on the worktable and the second predetermined scribing line is aligned to the liner opening; and
  a laser generator for generating a first laser beam over the worktable and a second laser beam under the worktable, wherein the first laser beam irradiates the first predetermined scribing line on the upper glass substrate of the laminated structure, and the second laser beam passes through the liner opening and irradiates the second predetermined scribing line on the lower glass substrate of the laminated structure;
  wherein, a horizontal distance between the first laser beam and the second laser beam is between approximately 5 and 10 cm.

20. The apparatus according to claim 19, wherein the worktable is horizontally moveable.

21. The apparatus according to claim 19, further comprising:
  a first X-Y scanner for horizontally moving the first laser beam; and
  a second X-Y scanner for horizontally moving the second laser beam.

22. The apparatus according to claim 21, further comprising at least one reflector between the first X-Y scanner and the laser generator, and at least one reflector between the second X-Y scanner and the laser generator.

23. The apparatus according to claim 19, further comprising a beam separator for separating the original laser beam generated from the laser generator into the first laser beam and the second laser beam.

24. A method of cutting a laminated structure formed by an upper glass substrate with a first predetermined scribing line and a lower glass substrate with a second predetermined scribing line, comprising steps of:
  providing a worktable with at least one liner opening, wherein the laminated structure is placed on the worktable and the second predetermined scribing line is aligned to the liner opening; and
  providing a first laser beam over the worktable, wherein the first laser beam irradiates the first predetermined scribing line on the upper glass substrate of the laminated structure; and
  providing a second laser beam under the worktable, wherein the second laser beam passes through the liner opening and irradiates the second predetermined scribing line on the lower glass substrate of the laminated structure;
  wherein, a horizontal distance between the first laser beam and the second laser beam is between approximately 5 and 10 cm.

25. The method according to claim 24, wherein the worktable is horizontally moveable.

26. The method according to claim 24, wherein the first laser beam and the second laser beam can horizontally move in position to each other.

27. The method according to claim 24, wherein the first predetermined scribing line and the second predetermined scribing line are formed by a laser.

28. The method according to claim 24, wherein the first predetermined scribing line and the second predetermined scribing line are formed by a blade.

* * * * *